(12) United States Patent
Geusic et al.

(10) Patent No.: US 6,972,257 B2
(45) Date of Patent: Dec. 6, 2005

(54) CONDUCTIVE MATERIAL PATTERNING METHODS

(75) Inventors: Joseph E. Geusic, Berkeley Heights, NJ (US); Alan R. Reinberg, Westport, CT (US)

(73) Assignee: Micron Technology, Inc., Boise, ID (US)

(*) Notice: Subject to any disclaimer, the term of this patent is extended or adjusted under 35 U.S.C. 154(b) by 22 days.

(21) Appl. No.: 10/462,476

(22) Filed: Jun. 16, 2003

(65) Prior Publication Data
US 2003/0219991 A1   Nov. 27, 2003

Related U.S. Application Data

(62) Division of application No. 09/648,884, filed on Aug. 25, 2000, now Pat. No. 6,602,653.

(51) Int. Cl.[7] .............................................. H01L 21/44
(52) U.S. Cl. .................. 438/687; 438/622; 438/669; 438/720; 438/754
(58) Field of Search .................... 438/622, 627–629, 438/669, 671, 680, 687, 754, 720

(56) References Cited

U.S. PATENT DOCUMENTS

| | | | |
|---|---|---|---|
| 4,352,716 A | 10/1982 | Schaible et al. | |
| 5,328,811 A | 7/1994 | Brestel | |
| 5,395,650 A | 3/1995 | Holl et al. | |
| 5,424,246 A | 6/1995 | Matsuo et al. | |
| 5,459,098 A | 10/1995 | Maya | |
| 5,686,789 A | 11/1997 | Schoenbach et al. | |
| 5,695,810 A | 12/1997 | Dubin et al. | |
| 5,736,002 A | 4/1998 | Allen et al. | |
| 5,744,376 A | 4/1998 | Chan et al. | |
| 5,925,415 A | 7/1999 | Fry et al. | |
| 5,939,334 A * | 8/1999 | Nguyen et al. | 438/689 |
| 5,993,679 A | 11/1999 | Koide et al. | |
| 6,100,184 A * | 8/2000 | Zhao et al. | 438/638 |
| 6,249,055 B1 | 6/2001 | Dubin | |
| 6,333,248 B1 | 12/2001 | Kishimoto | |
| 6,348,125 B1 | 2/2002 | Geusic et al. | |
| 6,593,656 B2 | 7/2003 | Ahn et al. | |
| 6,602,653 B1 | 8/2003 | Geusic et al. | |

FOREIGN PATENT DOCUMENTS

| | | |
|---|---|---|
| EP | 374 505 | 6/1990 |
| JP | 2000-216160 | 4/2000 |

(Continued)

OTHER PUBLICATIONS

El-Habachi et al., "Emission of excimer radiation from direct current, high-pressure hollow cathode discharges," *Appl Phys Lett*. 1998;72(1):22-24.

(Continued)

*Primary Examiner*—Carl Whitehead, Jr.
*Assistant Examiner*—Thanhha Pham
(74) *Attorney, Agent, or Firm*—Mueting, Raasch & Gebhardt, P.A.

(57) ABSTRACT

A patterning method includes providing a first material (e.g., copper) and transforming at a least a surface region of the first material to a second material (e.g., copper oxide). One or more portions of the second material (e.g., copper oxide) are converted to one or more converted portions of first material (e.g., copper) while one or more portions of the second material (e.g., copper oxide) remain. One or more portions of the remaining second material (e.g., copper oxide) are removed selectively relative to converted portions of first material (e.g., copper). Further, a thickness of the converted portions may be increased. Yet further, a diffusion barrier layer may be used for certain applications.

48 Claims, 6 Drawing Sheets

FOREIGN PATENT DOCUMENTS

WO      WO 98/53480      11/1998

OTHER PUBLICATIONS

El-Habachi et al., "Generation of intense excimer radiation from high-pressure hollow cathode discharges," *Appl Phys Lett*. 1998;73(7):885-887.

Esrom et al., "VUV light-induced deposition of palladium using an incoherent $Xe_2$ *excimer source," *Chemotronics*. 1989;4(3):202-208.

Fleisch et al., "An XPS study of the UV photoreduction of transition and noble metal oxides," *Applied Surface Science*. 1986;26:488-497.

Fleisch et al., "Reduction of copper oxides by UV radiation and atomic hydrogen studied by XPS," *Applications of Surface Science*. 1982;10(1):51-62.

Frame et al., "Microdischarge devices fabricated in silicon," *Appl Phys Lett*. 1997;71(9):1165-1167.

Jain et al., "Thermal dry-etching of copper using hydrogen peroxide and hexafluoroacetylacetone," *Thin Sold Films*. Nov. 15, 1995;269(1):51-56.

Kaloyeros et al., "Chemical vapor deposition of copper for multilevel metallization," *MRS Bulletin*. 1993;18(6):22-29.

Kang et al., "Dry etching of copper film with hexafluoroacetylacetone via oxidation process," *J Vac Sci Technol B*. 1999;17(1):154-157.

Kogelshatz, "Silent-discharge driven excimer UV sources and their applications," *Applied Surface Science*. 1992;54:410-423.

Lakshmanan et al., "A novel model of hydrogen plasma assisted chemical vapor deposition of copper," *Thin Solid Films*. 1999;338(1,2):24-39.

Lopatin et al., "Thin electroless barrier for copper films," Part of the SPIE Conference on Multilevel Interconnect Technology II, Santa Clara, CA, 1998; 3508:65-77.

Musil et al., "Microwave plasma enhanced low pressure D.C. sputtering of copper films," *Czechoslovak Journal of Physics*. 1996;46(4):353-368.

Pal et al., "Electrical properties of vacuum-evaporated copper films," *Thin Solid Films*. 1975;25:S25-S28.

Ryan et al., "Copper interconnects for advanced logic and DRAM," *Extended Abstracts of the 1998 International Conference on Solid State Devices and Materials*, Hiroshima, 1998;258-259.

Schoenbach et al., "Microhollow cathode discharges," *Appl Phys Lett*. 1996;68(1):13-15.

Shacham-Diamand et al., "High aspect ration quarter-micron electroless copper integrated technology," *Microelectronic Engineering*. 1997;37/38:77-88.

Zhang et al., "Efficient excimer ultraviolet sources from a dielectric barrier discharge in rare-gas/halogen mixtures," *J Apply Phys*. 1996;80(2):633-638.

\* cited by examiner

CONDUCTIVE MATERIAL PATTERNING METHODS

FIELD OF THE INVENTION

The present invention relates to patterning methods. More particularly, the present invention pertains to the patterning of conductive materials, e.g., copper.

BACKGROUND OF THE INVENTION

Integrated circuits generally include conductive, semiconductive, and insulative materials. Although various metals are used in the metallization of large-scale integrated circuits, many of such metals are difficult to fabricate in fine patterns because of the lack of adequate or suitable etching methods.

For example, copper is a well-recognized conductor. However, few integrated circuits having fine line patterns integrate copper as the conductor for metallization purposes because it is difficult to fabricate fine patterns of copper. There is a strong incentive to incorporate copper as a conductive material in integrated circuits because of its low resistivity, higher melting temperature relative to other metals, and higher electromigration resistance compared with other currently used conductive materials, such as aluminum alloys. As such, incorporation of copper as a conductive material in integrated circuits is desired so as to allow an increase in speed thereof.

One method of using copper for interconnect structures is by patterning the copper using a damascene-type method. Such a method employs the deposition of copper into predefined damascene trenches. Such a process, particularly when adjacent silicon-containing regions, requires that a diffusion barrier/liner layer be used within the trench. However, if the barrier thickness cannot be reduced as trench sizes become smaller, the impact on resistance of the conductor deposited in the trench is significant.

Further, the existing processing methods for patterning certain conductive materials, such as aluminum, are often ineffective for other conductive materials, such as copper. For example, dry etching methods are generally inadequate for providing thin copper conductor patterns.

SUMMARY OF THE INVENTION

The present invention provides patterning methods for patterning conductive materials in the fabrication of integrated circuits. For example, such methods are particularly advantageous for patterning hard to pattern conductive materials, such as copper, palladium, or platinum, or alloys thereof.

A patterning method according to the present invention includes providing a first material and transforming at least a surface region of the first material to a second material. One or more portions of the second material are converted to one or more converted portions of first material while one or more portions of the second material remain. One or more portions of the remaining second material are removed selectively relative to converted portions of first material.

In one embodiment of this method, providing the first material may include forming a first material comprising copper or an alloy thereof. Further, transforming at least a surface region of the first material to a second material may include transforming at least a surface region of the copper or copper alloy to a copper oxide material, e.g., oxidizing the first material.

In another embodiment of this method, converting the one or more portions of the second material may include exposing the one or more portions of the second material to radiation, e.g., using a broadband radiation source and a photo mask or using a scanning laser.

In yet another embodiment of the method, a layer thickness of the one or more converted portions of first material may be increased, e.g., electroplating material on the one or more converted portions of first material or electroless depositing of material on the one or more converted portions of first material. For example, such increasing of the thickness may be performed prior to or after removing the one or more portions of the remaining second material selectively relative to converted portions of first material.

Another patterning method according to the present invention includes providing a layer on a substrate. The layer includes a first chemical composition and is treated to transform at least a region of the layer to a second chemical composition. The layer is then patterned by converting one or more portions of the transformed region including the second chemical composition to one or more converted portions including the first chemical composition with one or more portions including the second chemical composition remaining. The one or more remaining portions including the second chemical composition are removed selectively relative to the one or more converted portions including the first chemical composition.

In various embodiment of this method, for example, the layer including the first composition may be transformed to a metal oxide (e.g., by oxidation), one or more portions of the transformed region including the second chemical composition may be converted to one or more converted portions including the first chemical composition by exposing the one or more portions of the transformed region comprising the second chemical composition to radiation (e.g., using a broadband source and a photo mask or using a scanning laser), the first chemical composition may include an elemental metal which is transformed to a second chemical composition comprising a metal oxide, a thickness of one or more converted portions comprising the first chemical composition may be increased, and the first chemical composition may include copper and the second chemical composition may include copper oxide.

Another method according to the present invention includes providing metal oxide comprising material on a substrate and transforming one or more regions of the metal oxide comprising material to one or more regions of an elemental metal comprising material while leaving one or more remaining regions of the metal oxide comprising material. Thereafter, one or more of the remaining regions of the metal oxide comprising material are removed selectively relative to the one or more regions of the elemental metal comprising material to form conductors on the substrate.

In various embodiments of this method, for example, providing the metal oxide comprising material on a substrate may include forming an elemental metal comprising material on the substrate and oxidizing substantially all of the elemental metal comprising material to form the metal oxide comprising material, the elemental metal comprising material may be one of copper and a copper alloy and the metal oxide comprising material may include copper oxide, transforming the one or more regions of the metal oxide comprising material may include exposing the metal oxide comprising material to radiation, removing the one or more of the remaining regions of the metal oxide comprising material may includes etching one or more of the remaining regions of the metal oxide comprising material with an etchant (e.g., hexafluoroacetylacetone), a thickness of the conductors on the substrate may be increased, and a diffusion barrier material may be used therewith.

A metal conductor patterning method is also described according to the present invention. The method includes providing a layer of copper on a substrate, transforming at least a surface region of the copper to a copper oxide, converting one or more portions of the copper oxide to one or more converted portions of copper while at least other portions of the copper oxide remain, and removing substantially all of the portions of the copper oxide remaining relative to the copper resulting in copper conductors on the substrate. For example, converting the one or more portions of the copper oxide to one or more converted portions of copper may include photoreducing the one or more portions of copper oxide to copper. Further, the method may include increasing a thickness of the copper conductors such as by electroplating material on the one or more converted portions of copper or electroless depositing of material on the one or more converted portions of copper.

Yet another patterning method according to the present invention includes forming diffusion barrier material on a substrate, forming a first material on at least a portion of the diffusion barrier material and transforming at least a surface region of the first material to a second material. One or more portions of the second material are converted to one or more converted portions of first material while at least one or more portions of the second material overlying diffusion barrier material remain. One or more of the remaining portions of second material are removed selectively relative to the one or more converted portions of first material exposing diffusion barrier material thereunder and the exposed diffusion barrier material is removed selectively relative to the one or more converted portions of first material.

In various embodiments of this method, forming the diffusion barrier material may include depositing the diffusion barrier material on the substrate by chemical vapor deposition or may include forming the diffusion barrier material on the substrate by electroless deposition.

In another embodiment, this method may further include increasing a thickness of the one or more converted portions of first material. Further, an additional diffusion barrier layer may be formed over the one or more converted portions of first material having an increased thickness, e.g., forming the additional diffusion barrier layer by electroless deposition.

In yet another conductor patterning method according to the present invention, the method includes forming a diffusion barrier material including cobalt, tungsten, and phosphorous on a silicon-containing region of a substrate (e.g., by chemical vapor deposition or electroless deposition) and forming a first material comprising copper on the diffusion barrier material. At least a surface region of the first material comprising copper is oxidized to a second material comprising copper oxide. One or more portions of the second material comprising copper oxide is converted to one or more converted portions of first material comprising copper while leaving at least one or more portions of the second material comprising copper oxide remaining over underlying portions of the diffusion barrier material, e.g. photoreduction of the copper oxide. One or more of the remaining portions of second material comprising copper oxide are removed selectively relative to the first material comprising copper exposing underlying diffusion barrier material. Further, the exposed diffusion barrier material is removed.

In one embodiment of this method, a thickness of one or more converted portions of the first material comprising copper may be increased e.g., by electroplating material on the one or more converted portions comprising copper or by depositing material on the one or more converted portions of first material comprising copper by electroless deposition.

In another embodiment of this method, additional diffusion barrier material may be formed over the one or more converted portions of the first material comprising copper, or over the one or more converted portions of the first material comprising copper having an increased thickness, to provide a barrier completely about the converted portions. For example, the additional diffusion barrier material may include cobalt, tungsten, and phosphorous.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

BRIEF DESCRIPTION OF THE DRAWINGS

The present invention will be better understood from reading the following description of illustrative embodiments with reference to the attached drawings, wherein below.

DETAILED DESCRIPTION OF THE EMBODIMENTS

Figure 1:
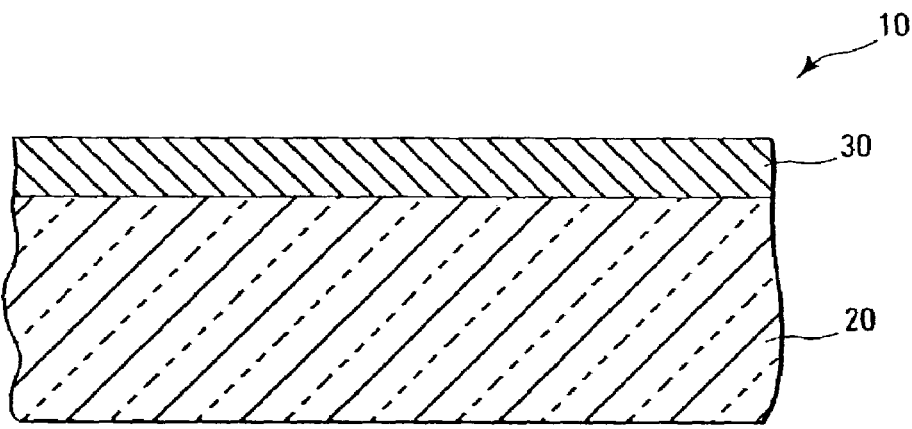
FIGS. 1–5 are sectional views illustrating a patterning method according to the present invention.
Figure 2:
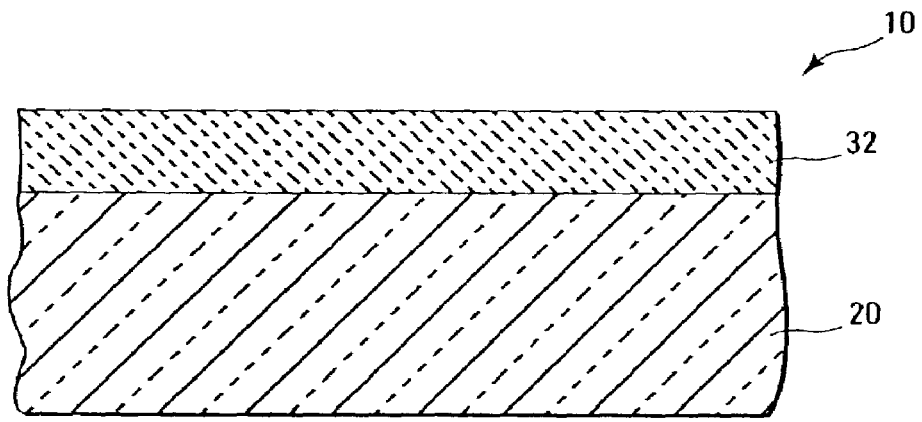
Figure 3:
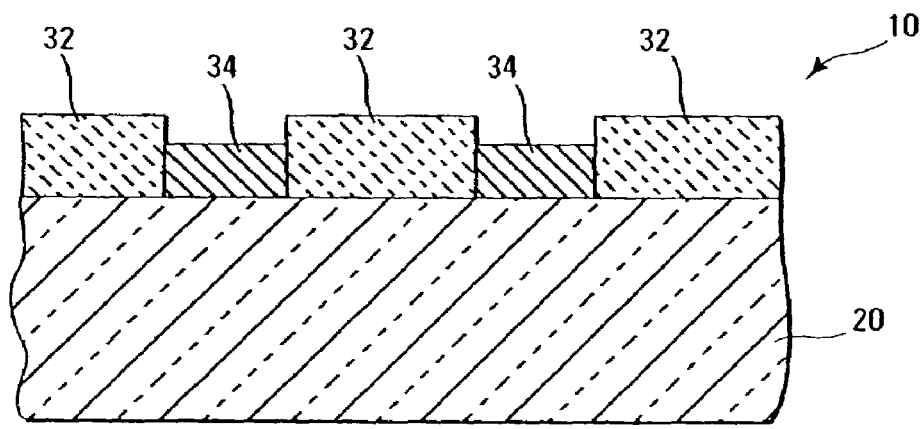

Generally, according to the present invention, the patterning method described with reference to FIGS. 1–5 includes forming a first material 30, as illustrated in FIG. 1, and transforming at least a surface layer of the first material 30 to a second material 32, as shown in FIG. 2. Thereafter, the method includes converting one or more portions of the second material 32 back to one or more converted portions 34 of first material as shown in FIG. 3. Upon such conversion, one or more portions of the second material 32 remain. Thereafter, the second material 32 is selectively removed relative to the converted portions 34 of first material. One potential use for such a method is in formation of a pattern of the first material, e.g., a pattern of conductors.

With reference to FIG. 1, a semiconductor wafer portion 10 is shown to include a substrate 20 and a first material 30 formed thereon. First material 30 may be an elemental metal, e.g., copper, alloys thereof, as well as other materials. For example, first material 30 may include copper, palladium or platinum, or alloys thereof such as copper palladium alloy or copper platinum alloy. The present invention is particularly advantageous in the patterning of copper and/or copper alloys.

The invention is not limited in application to semiconductor wafers, however, wafer fabrication constitutes one particularly advantageous application. Although first material 30 is formed on substrate 20 in FIG. 1, first material 30 may instead comprise an entire article or a portion of an article without being formed on a substrate, such as substrate 20. In the context of this document, the term "semiconductor substrate" is defined to mean any construction including semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductor substrates described above.

FIG. 2 shows wafer portion 10 wherein first material 30 on substrate 20 is transformed to second material 32. For example, second material 32 may include a metal oxide or a metal oxide-comprising material as well as other materials. In FIG. 2, the entire thickness of first material 30 is transformed to second material 32. However, in an alternate process, less than the full thickness of first material 30 may be transformed to second material 32. For example, transforming only a surface layer of first material 30 to second material 32 may be preferred particularly when first material 30 is not formed on a substrate. Transforming only a surface region is further discussed below with reference to FIGS. 7–11.

Transformation of first material 30 to second material 32 may be accomplished by oxidation, among other methods. Oxidation of a metal may be conducted by a variety of methods, however, one particular method is believed advantageous for copper. For example, a copper film having a thickness in the range of about 10 Å to about 500 Å may be formed on the substrate 20. The copper film may be formed by any suitable method, such as evaporation, sputtering, or chemical vapor deposition processes. The copper may be exposed to a plasma including $O_2$, $O_3$, or, preferably, $O_2$ and $O_3$. For example, at a temperature in the range of about 100° C. to about 400° C., preferably 200° C. or greater, an oxidation rate of 200 Å per minute or higher may be achieved. For a lower oxidation rate, temperature less than 200° C. may be used. It should be noted that if layer 30 is copper and is entirely converted to copper oxide, the copper oxide layer 32 resulting will be about 1.67 times as thick as the copper layer 30. Such an oxidation method may also be applicable to different elemental metals, metal-comprising materials, and other materials.

FIG. 3 shows a portion of second material 32 converted back to portions 34 of first material, creating a patterned first material. Such conversion leaves other portions remaining as second material 32, as shown in FIG. 3. Converting one or more portions of second material 32 back to the first material may include exposing second material 32 to radiation to reduce an oxidation state, e.g., photoreduction. For example, the oxidation state of second material 32 may be reduced by radiation exposure, yielding first material. Various illumination techniques may reduce a metal oxide-comprising material to an elemental metal-comprising material. It is also conceivable that other methods may be used to reduce a metal oxide or metal oxide-comprising material to an elemental metal or to convert a second material back to a first material.

For copper oxide, ultraviolet photoreduction of copper oxide to copper metal may be performed with radiation, preferably, having a wavelength of less than or equal to about 468 nanometers (nm). Particularly advantageous results may be achieved when temperature is maintained in a range of about 10° C. to about 100° C. At a radiation intensity of approximately 1.0 Watt per square centimeter, a 50 Å copper oxide layer may be photoreduced to a copper layer in less than about one minute. Generally, a radiation intensity of less than about 60 Watts per square centimeter may be sufficient to photoreduce most copper oxide layers. However, depending on the needs of a particular application, radiation intensity may be higher. Photoreduction of metal oxides is described in U.S. patent application Ser. No. 09/484,683, entitled "Removal of Copper Oxides From Integrated Interconnects" filed Jan. 17, 2000.

A variety of exposure techniques can accomplish converting one or more portions of second material 32 in FIG. 2 back to portions 34 of first material while leaving other portions remaining as second material 32. One illustrative method includes providing a mask over the layer 32 and illuminating the unmasked portions of the layer. For example, a patterned photoresist or other masking material is formed on or over second material 32, e.g., copper oxide, with openings in areas where it is desired to convert second material 32 back to the first material, e.g., copper. Thereafter, a broadband UV source, either coherent or incoherent, may be used to illuminate the second material 32, e.g., copper oxide.

Radiation may also be used to provide patterned material by numerous other methods without forming a photoresist or masking material on second material 32. For example, a scanned, focused UV laser may accomplish the desired conversion of a portion of second material 32. Two suitable lasers include a KrF (wavelength—248 nm) laser or an ArF (wavelength—193 nm) laser.

Figure 4:
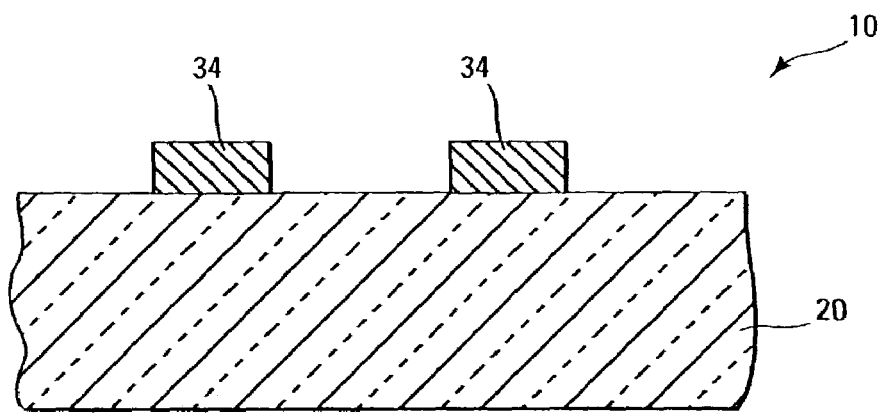

FIG. 4 shows wafer portion 10 after removal of second material 32 selectively relative to patterned first material 34. To accomplish selective removal, second material 32 is preferably removed at a removal rate of about 200 Å/minute to about 1400 Å/minute producing a selectivity ratio greater than about 20:1 with respect to the removal rate of patterned first material 34. The acceptability of a particular selectivity ratio depends on a variety of factors, including the type of application, the tolerance levels for removal of patterned first material 34 during removal of second material 32, the intended function for patterned first material 34, etc.

Removing second material 32 may include a variety of methods. One illustrative removal method includes etching second material 32 with a gaseous etchant. For example, for copper oxide, and perhaps other materials, the gaseous etchant may comprise hexafluoroacetylacetone (H(hfac)). The H(hfac) is believed to form a volatile copper compound [bis-hexafluoroacetylacetonate: $Cu(hfac)_2$] and water vapor when the gas is heated to a predetermined temperature and the copper oxide surface is at a predetermined temperature. The volatile composition and water vapor can then be carried off with the flow of the gaseous etchant, (H(hfac)). Therefore, the copper oxide is selectively removed relative to first material 34, such as elemental copper. In one illustrative embodiment, the temperature of H(hfac) gas may be approximately 40° C. with a copper oxide surface temperature of approximately 200° C. However, the gas temperature may range from 30° C. to 250° C. and the copper oxide temperature may range from 50° C. to 400° C. The copper oxide removal rate may be greater than 200 Å/minute when using certain flow rates of gaseous etchant.

As the present invention has application in pattern forming methods, another aspect of the invention includes a patterned layer forming method wherein a layer is formed over a substrate, the layer includes a first chemical composition (e.g., copper). The method further includes first treating the layer to transform at least a portion of the layer to a second chemical composition (e.g., copper oxide) and then treating the layer to convert at least a portion of the second chemical composition back to the first chemical composition (e.g., copper). The layer may then be patterned by removing the second chemical composition (e.g., copper oxide) selectively relative to the first chemical composition (e.g., copper). FIGS. 1–4 show one example of implementing such a method in the case of semiconductive wafer portion 10. However, other implementations may be used.

One such implementation includes a metal patterning method. In one aspect of the invention, the metal patterning method includes providing a layer of a metal oxide-comprising material on a substrate. A region of the metal oxide-comprising material may be transformed to a metal-comprising material while leaving a remaining region of the metal oxide-comprising material. Removing at least some of the remaining region of the metal oxide-comprising material selectively relative to the metal-comprising material is conducted to form a pattern on the substrate comprising the metal-comprising material.

One possible method for forming a layer of the metal oxide-comprising material includes forming a layer of elemental metal on the substrate and transforming substantially all of the elemental metal to the metal oxide-comprising material. It is also conceivable within the present invention that a layer of other than elemental metal may be formed on a substrate and transformed, at least in part, to metal oxide or a metal oxide-comprising material. Nevertheless, significant advantages may exist to using elemental metals, such as one or more of copper, palladium, or platinum.

For example, a copper conductor pattern may be formed by first forming a layer of elemental copper on a substrate. The copper layer may be approximately 50 Å but preferably ranges from about 10 Å thick to about 100 Å. As discussed below, the copper layer may even be more than 100 Å thick depending on the particular application. A less than 100 Å thickness may provide advantages in forming of the copper conductor pattern. For example, a thickness less than 100 Å allows for rapid and uniform formation of the oxide and easy conversion of the entire film to the oxide thereof. Further, for example, because of the thin nature of the layer, better pattern definition can be attained. However, other thicknesses may be preferred depending on the particular materials used or the ultimate structure to be formed therefrom. The copper layer may be transformed in part or in its entirety to copper oxide. One or more regions of the copper oxide may then be converted back to copper by chemical reduction (reducing an oxidation state), e.g., photoreduction. Selective removal of the copper oxide may then be performed, leaving behind a copper conductor pattern.

Figure 5:
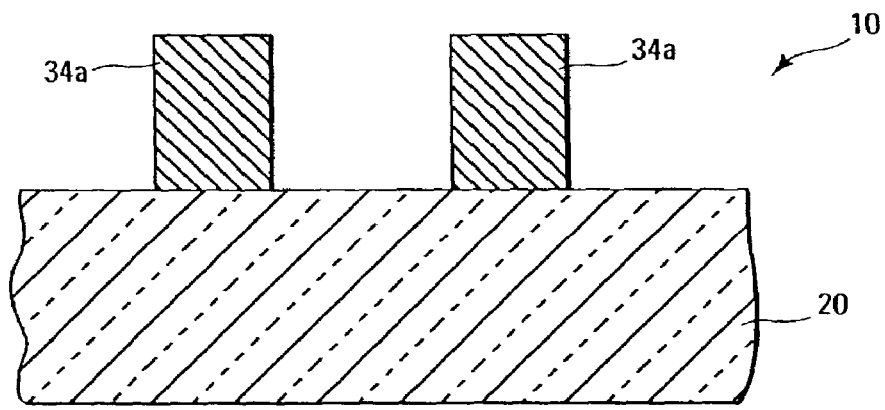
Figure 6:
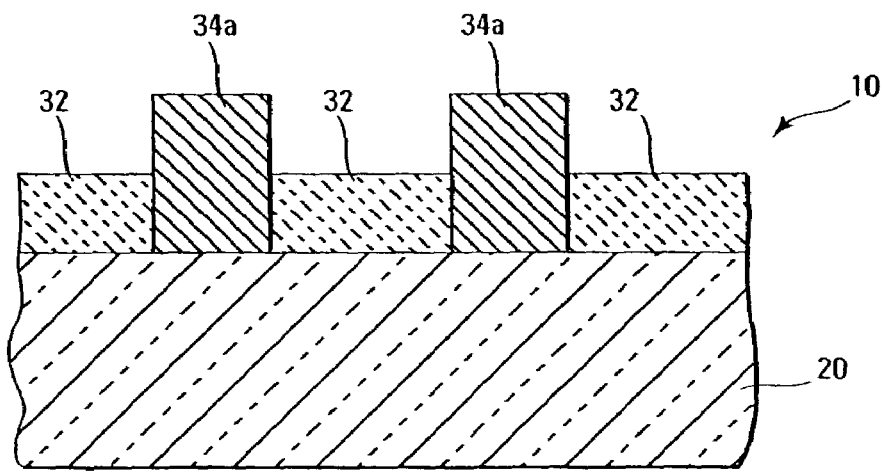
FIG. 6 is a sectional view illustrating alternate processing steps for certain steps shown in FIGS. 1–5.

In yet another aspect of the present invention, the method may further comprise increasing a thickness of patterned first material 34 shown in FIG. 4. Increasing the layer thickness may occur after a selective removal of second material 32 relative to patterned first material 34, as shown in FIG. 5, to produce an increased first material 34a. However, increased first material 34a may also be formed prior to selective removal of second material 32 relative to first material 34 as shown in FIG. 6.

A variety of potential methods for increasing a thickness of patterned first material 34 may be used. For a conductive patterned first material 34, such as metal conductors (e.g., copper), electroplating or electroless deposition may be used to increase a thickness of patterned first material 34. Notably, increasing a thickness of a pattern comprising a first material may include adding material other than the first material on or over the first material. For example, increasing a layer thickness of a pattern comprising a first chemical composition may include forming additional material other than the first chemical composition over the pattern. For electroless deposition, the material chosen to increase the layer thickness may be one for which the patterned material comprises a suitable activator as known among those skilled in the art of electroless deposition. For example, copper as patterned first material 34 may comprise a suitable activator for subsequent electroless deposition of additional copper as well as other metals and other materials.

First material 30 may be formed directly on substrate 20 as shown in FIG. 1. However, depending on the material types of first material 30 and substrate 20, other materials may also exist between first material 30 and substrate 20. For example, if first material 30 may diffuse into substrate 20, then a barrier layer may be provided between the materials to prevent such diffusion. For example, copper may diffuse into silicon or germanium substrates. As described further below, a diffusion barrier layer may be used when copper is formed on silicon-containing substrates. Other requirements may exist for formation of first material 30 on substrate 20 depending on the particular formation method. A few suitable methods for forming first material 30 on substrate 20, particularly when first material 30 is a metal, such as copper, include evaporation, sputtering, and chemical vapor deposition. Such methods may be conducted according to the knowledge of those skilled in the art in light of the disclosure herein of the present invention.

Figure 7:
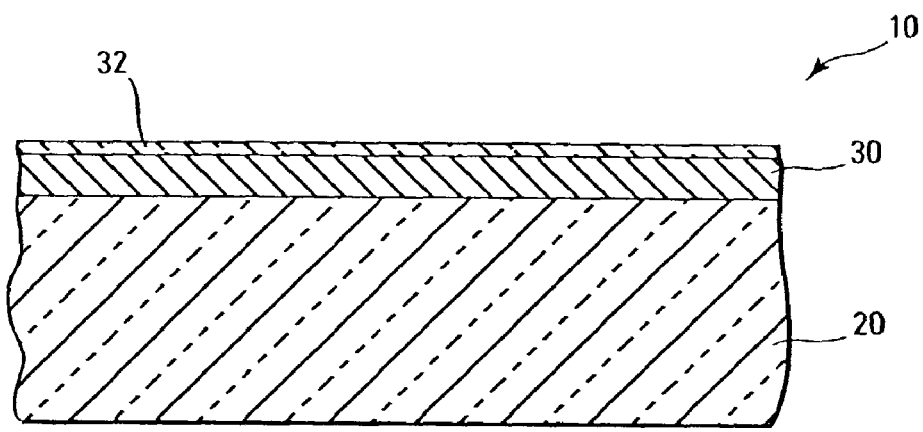
FIGS. 7–11 are sectional views illustrating another alternate patterning method according to the present invention.

In one alternate illustrative embodiment of the present invention, only a surface region of first material 30 is transformed to second material 32 as shown in FIG. 7. A variety of circumstances may exist wherein only a region of first material 30 is transformed as shown. For example, when first material 30 is copper, the copper may be converted into copper oxide as second material 32. Depending on radiation source properties and copper oxide properties, 468 nm radiation may only partially penetrate, e.g., about 100 Å, into copper oxide. Therefore, it may be desired to transform only an upper region of the copper such that the transformed thickness can be completely converted back to copper. Accordingly, transforming at least a surface layer or at least an outer portion of first material 30 may include transforming substantially all of first material 30, as shown in FIG. 2, or may include transforming less than substantially all of first material 30, as shown in FIG. 7.

Figure 8:
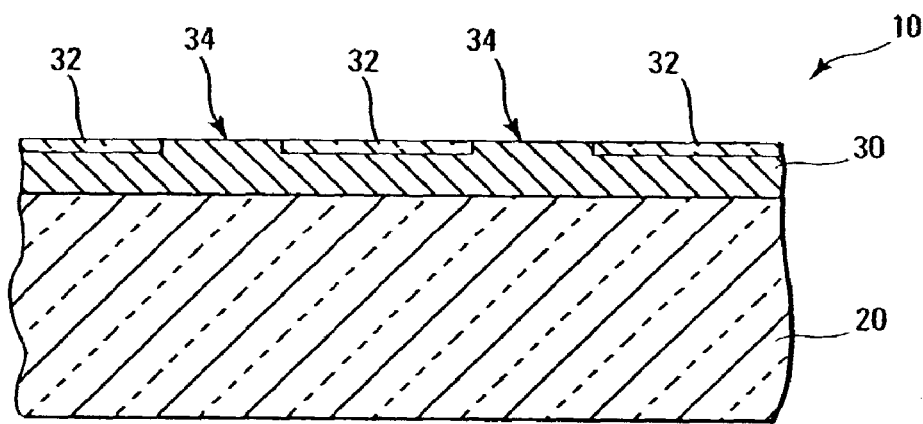
Figure 9:
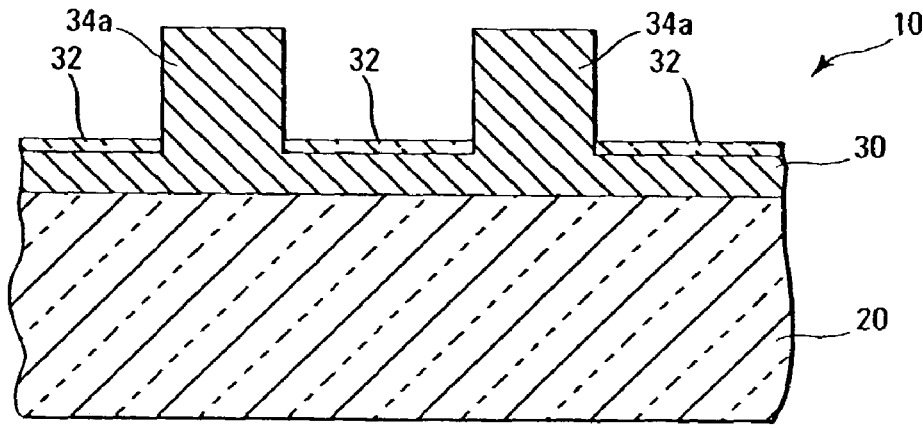
Figure 10:
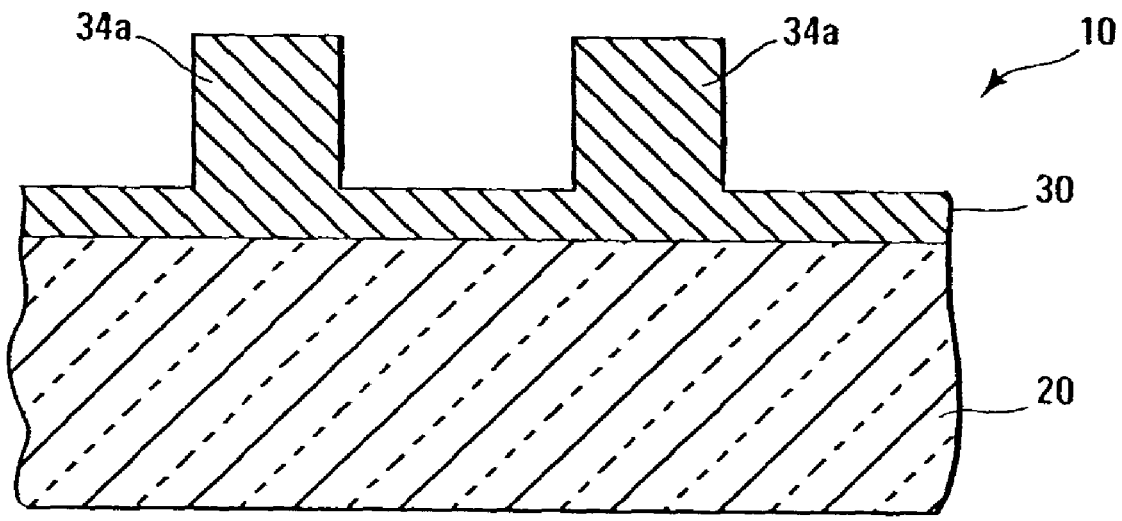

Nevertheless, the present invention may proceed even though less than substantially all of first material 30 is transformed to second material 32, as shown in FIGS. 7–11. FIG. 8 shows one or more portions of second material 32 converted back to the first material to form patterned first material 34 while leaving other portions remaining as second material 32. In such figures, the thickness difference between the transformed materials, e.g., second material 32, relative to the patterned first material 34 is not shown as the thickness difference is very small. FIG. 9 shows increasing a layer thickness of patterned first material 34 to form increased first material 34a. As noted above, the method may instead include increasing a layer thickness of the pattern with a material other than the first material. FIG. 10 shows second material 32 selectively removed relative to first material 30 and increased first material 34a.

Figure 11:
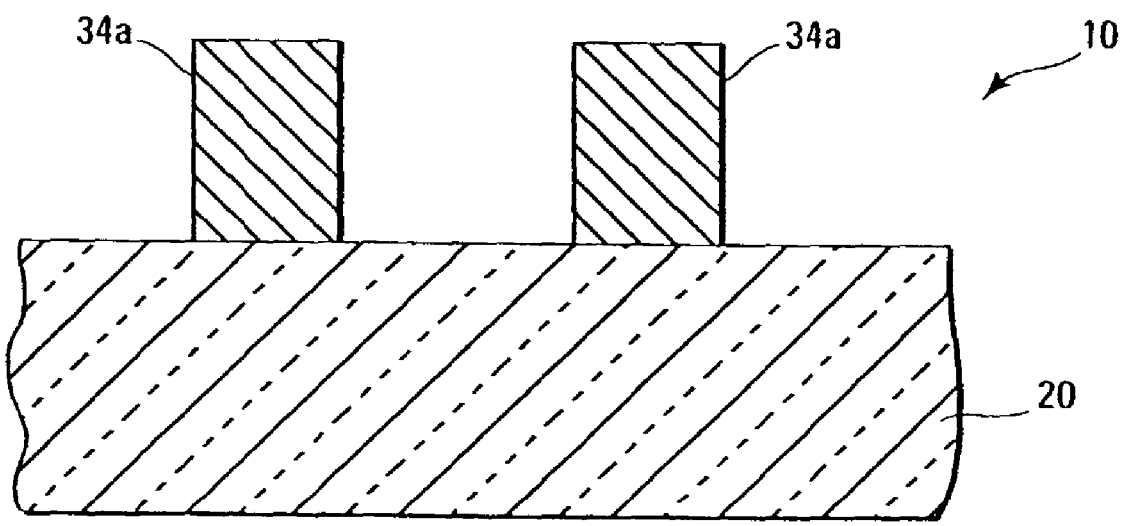

In the alternate illustrative embodiment shown by FIGS. 7–11, the substrate on which second material 32 is formed comprises first material 30. Accordingly, the method may further comprise removing at least some of first material 30 formerly beneath the removed second material 32 to extend the pattern to the substrate as shown in FIG. 11. Wafer portion 10 of FIG. 10 may be processed by such a method with an anisotropic etch. For example, for removal of copper, such an etch may include ion milling, sputter etching using halides or oxidizing agents, or reactive ion etching using chlorine containing agents. Further, for example, copper may be etched as described in U.S. Pat. No. 4,352, 716 to Schaible et al., entitled "Dry Etching of Copper Patterns" issued Oct. 5, 1982. Even though such an etch may reduce the thickness of increased first material 34a, such thickness may be decreased by an amount roughly approximate the thickness of first material 30 formerly beneath the removed second material 32. Accordingly, a sufficient portion of increased first material 34a may remain to provide a pattern of the first material. It is further conceivable that patterned first material 34 may be increased sufficiently in forming increased first material 34a to compensate for a subsequent blanket etch.

Yet another aspect of the present invention may be further described by the following example:

EXAMPLE

A 50 Å copper film is deposited on a barrier layer over a monocrystalline silicon wafer by sputtering. The copper film is oxidized at approximately 200° C. with an $O_2/O_3$ plasma for approximately 15 seconds. A photoresist mask is formed on the copper oxide and patterned by exposure to actinic energy through an exposure reticle. The resulting wafer is illuminated with a broad area source of 468 nm ultraviolet radiation at an intensity of about 1.0 Watt per square centimeter using the patterned photoresist mask. Such radiation converts the copper oxide exposed through the openings in the photoresist mask to metallic copper to a depth of approximately 50 Å after processing for approximately 1 minute. The photoresist is removed followed by removal of the unconverted copper oxide using H(hfac) gas at approximately 40° C. while maintaining the copper oxide surface at approximately 200° C. Selective copper oxide etching is completed after approximately 15 seconds. Electroless deposition of additional copper on the patterned copper is performed to form conductive copper patterns with a thickness of approximately 0.5 micrometers.

As described above, when certain materials are formed on other materials, diffusion therebetween may occur. As such, barrier layers must be provided to prevent such diffusion. For example, diffusion barrier materials are generally required when copper conductors are patterned on silicon substrates. FIGS. 12–17 provide sectional views illustrating an embodiment of a patterning method when a diffusion barrier material is used. Generally, such a patterning method may be used in the formation of copper conductors on silicon. For example, a copper conductor pattern may be formed by locally exposing a uniform thin layer of copper oxide using either broad area UV source illumination and a photo mask or a scanned, focused UV laser as described previously herein. Such processing may include forming a diffusion barrier layer, e.g., CoWP, around the copper conductor. For example, such a diffusion barrier layer may be formed by electroless deposition.

Figure 12:
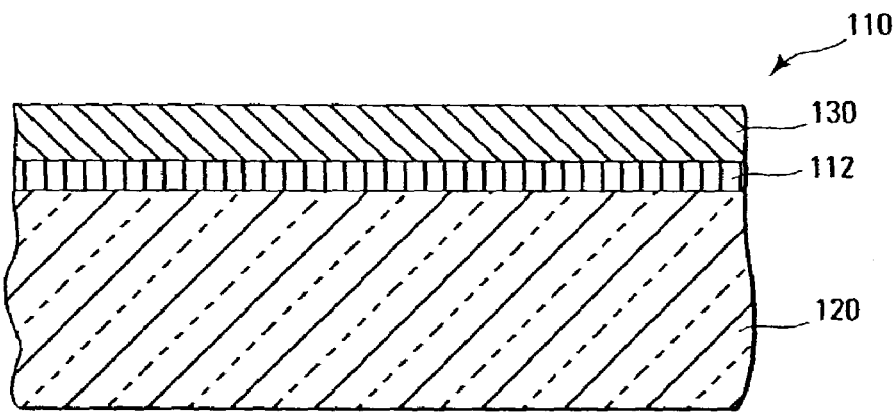
FIGS. 12–17 are sectional views illustrating yet another alternate patterning method wherein a diffusion barrier material is used according to the present invention.

FIG. 12 shows a wafer portion 110 wherein a diffusion barrier material 112 is formed on substrate 120. A first material 130 is then formed on at least a portion of the diffusion barrier layer 112. For example, the first material 130 may be an elemental metal or an alloy thereof. Further, for example, in one preferred embodiment of the present invention, the first material 130 is a copper-comprising material such as elemental copper or a copper alloy such as copper palladium or copper platinum. When the first material 130 is a copper-comprising material, one preferred diffusion barrier material includes cobalt, tungsten, and phosphorous.

Preferably, diffusion barrier layer 112 including cobalt, tungsten, and phosphorous is formed on a silicon-containing substrate 120 by any suitable method. For example, such a base diffusion barrier layer 112 may be formed by either chemical vapor deposition or by electroless deposition. For example, CoWP barrier material and formation thereof is described in U.S. Pat. No. 5,695,810 to Dubin et al., entitled "Use of Cobalt Tungsten Phosphide as a Barrier Material for Copper Metallization" issued Dec. 9, 1997; in the article, "Thin Electroless Barrier for Copper Films," by Lopatin et al., *Part of the SPIE Conference on Multi-Level Internet Technology II, Santa Clara Calif.* (September 1998); and in the article entitled, "High Aspect Ratio Quarter-Micron Electroless Copper Integrated Technology," by Shacham-Diamand et al., *Microelectronic Engineering*, 37/38 (1997), pp. 77–88. Preferably, for example, the base diffusion barrier layer 112 including cobalt, tungsten, and phosphorous is formed to a thickness in the range of about 20 Å to about 100 Å. Further, for example, preferably, the diffusion barrier layer includes cobalt, tungsten, and phosphorous, wherein the layer includes cobalt in the range of about 84% to about 88%, about 2% to about 4% of tungsten, and about 10% to about 12% of phosphorous. In one illustrative embodiment, the base diffusion barrier layer 112 is formed of cobalt at about 87%, tungsten at about 2%, and phosphorous at about 11%.

Figure 13:
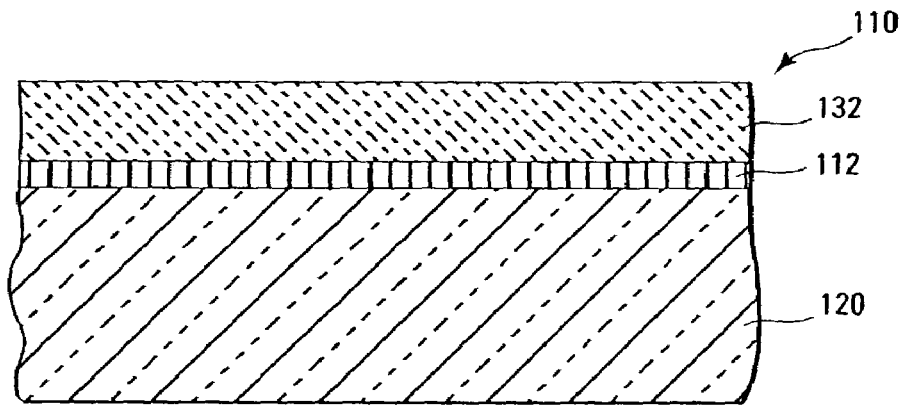

Thereafter, preferably, the first material 130 includes copper and is formed over the base diffusion barrier layer 112. The copper is deposited over the diffusion barrier layer 112 by a suitable method. For example, the copper may be formed by evaporation, sputtering, or chemical vapor deposition as previously described herein. Further, the copper is preferably formed to a thickness in the range of about 10 Å to about 200 Å. Thereafter, just as described with reference to FIG. 2, the first material 130 is transformed to second material 132 as shown in FIG. 13. As shown in FIG. 13, the entire portion of first material 130 is transformed to second material 132, however, as previously described herein, less than the full thickness of the first material 130 may be transformed to second material 132. Further, as previously described herein, transformation of first material 130 may be accomplished by oxidation, among other methods. For example, with regard to forming copper conductors, the copper material 130 may be exposed to a plasma oxidation process. For example, the plasma may include $O_2$, $O_3$, or, preferably, $O_2$ and $O_3$. For example, a copper material may be oxidized to copper oxide at a temperature in the range of about 100° C. to about 400° C., preferably at about 200° C. For example, such oxidation occurs as described in the article entitled, "Dry Etching of Copper Film With Hexafluoroacetylacetone Via Oxidation Process," by Kang et al., *J. Vac. Sci. Technol.*, B17(1) January/February 1999.

Figure 14:
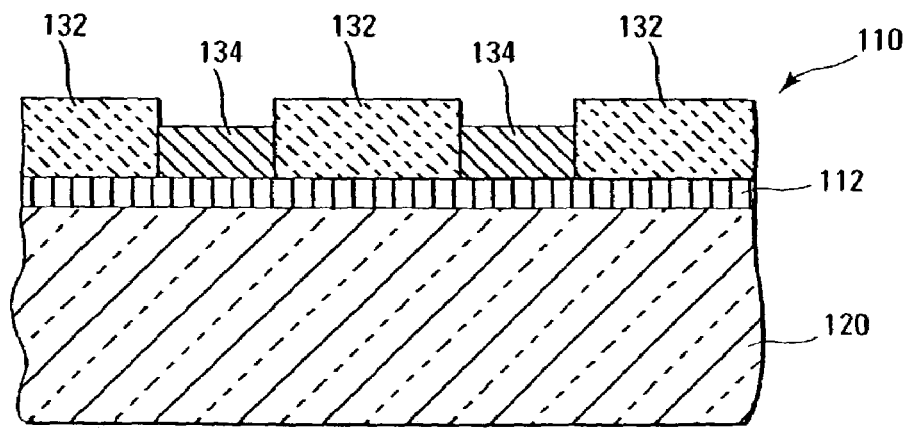

After the first material 130 is transformed to second material 132, one or more portions of second material 132 is converted to one or more converted portions 134 of the first material as shown in FIG. 14. Such a conversion leaves other portions of second material 132 remaining. Any suitable method of converting portions of the second material 132 to the converted portions 134 of first material may be used according to the present invention. Preferably, as previously described herein, the second material 132 is an oxide of the first material 130 which is formed of at least one metal material.

More specifically, with regard to the formation of patterned copper conductors, first material 130 includes copper and second material 132 includes copper oxide. The one or more portions of second material 132, e.g., copper oxide, are converted to converted portions 134 of copper by exposure to radiation to reduce an oxidation state of the copper oxide, e.g., photoreduction. Such a conversion process for copper was previously described herein with reference to FIGS. 1–6 and will not be further described in detail with reference to FIGS. 12–17. Generally, for example, such exposure to radiation may be provided by selectively exposing one or more portions of the copper oxide to a broad area UV source using a mask. For example, a source wavelength less than 486 nm and an intensity of approximately 1.0 Watt/cm$^2$ which illuminates copper oxide photoreduces the copper oxide to copper. Further, as previously described herein, the illumination may be incoherent or coherent. In addition, a scanned, focused laser may also be used to photoreduce one or more portions of the copper oxide. The result of the photoreduction of the copper oxide is shown in FIG. 14 as the patterned converted portions 134 of copper.

After the photoreduction of the second material 132 to the pattern 134 of first material, the remaining portions of second material 132 as shown in FIG. 14 are removed. Such method of removal depends entirely upon the type of second material 132 present. For example, to remove second material 132 comprising copper oxide, preferably, exposure to a gaseous etchant (e.g., hexafluoroacetylacetone) is used in a manner as described previously with reference to FIGS. 1–6.

Upon removal of the remaining portions of second material 132 as shown in FIG. 14, portions of the diffusion barrier layer 112 underlying such portions now removed are exposed. With such portions of the diffusion barrier layer 112 exposed, a suitable process is used to remove such exposed material to the upper surface of the substrate 120. The process will depend on the composition of the diffusion barrier material 112.

In one preferred embodiment of the present invention, wherein the diffusion barrier material includes cobalt, tungsten, and phosphorous, the diffusion barrier material 112 not under the converted portions 134 of copper is removed. For example, a diffusion barrier material including cobalt, tungsten, and phosphorous may be removed by ion milling or sputter etching. For example, an energized argon plasma may be used to sputter the diffusion barrier material.

Figure 15:
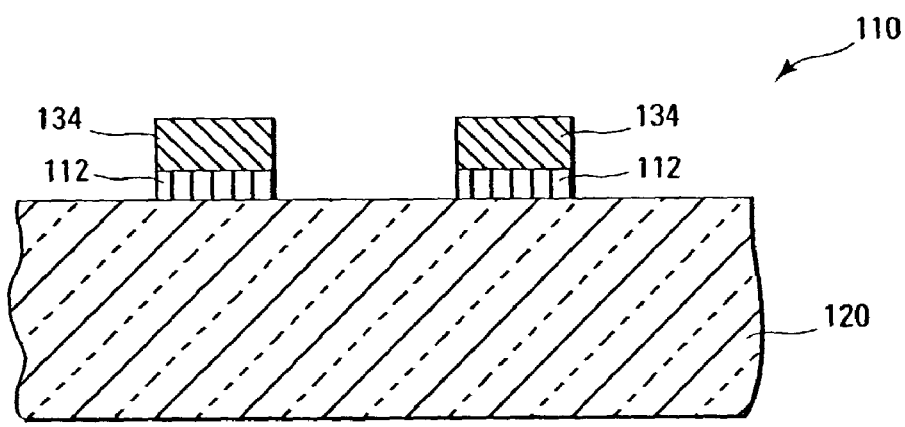
Figure 16:
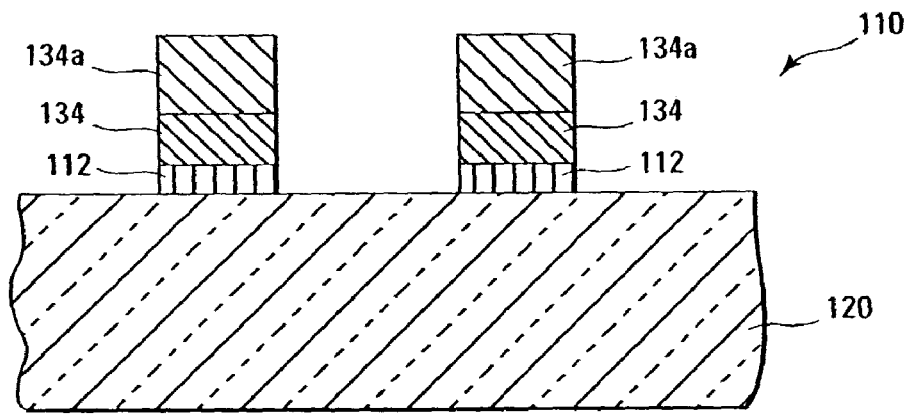

FIG. 15 shows the resulting structure with the converted portions 134 of first material 130 stacked with diffusion barrier material 112. The other portions of second material 132 are removed along with any diffusion barrier material 112 underlying such second material portions. Thereafter, in one embodiment of the present invention, a thickness of the patterned converted portions 134 of first material is increased as shown by the addition of material 134a in FIG. 16. Such an increase in thickness of the patterned converted portions 134 has been previously described herein with reference to FIGS. 1–6 and shall not be described herein in detail with reference to FIGS. 12–17. However, in general, preferably, such an increase in thickness of the converted portions 134 is preferably accomplished by electroplating or electroless deposition. For example, in a case where converted portions 134 are copper conductors, such copper conductors 134 are increased in thickness preferably by electroless deposition. However, one skilled in the art will recognize that such increase in thickness is an optional processing step and converted portions 134 may function as conductors without any increase in thickness, if desired.

Generally, after an increase in thickness of the converted portions 134 comprising first material, a top diffusion barrier material 126 is formed. Preferably, the diffusion barrier material is formed to provide a barrier about the entire conductor, e.g., converted portion 134 and additional material 134a. Further, preferably, the thickness of the diffusion barrier material 126 is in the range of about 20 Å to about 100 Å and conformally formed over the material of portions 134 and 134a. Preferably, the diffusion barrier material is a material that can be electroless deposited. As such, the process of forming the diffusion barrier and at least portions of the materials encompassed thereby can be formed by electroless deposition. This is desirable because electroless deposition results in a more uniform and conformal barrier layer requiring fewer patterning and removal process steps.

Preferably, when the converted portions 134 and additional material 134a includes copper, the top diffusion barrier material 126 is the same as barrier material 112 and includes cobalt, tungsten, and phosphorous. Such materials are of the same type of composition as described previously with reference to FIG. 12. As a diffusion barrier material 126 including cobalt, tungsten, and phosphorous can be formed by electroless deposition, it is a preferred diffusion barrier material. However, other barrier materials which may be selectively deposited on the conductor material relative to the substrate 120, e.g., electroless deposition on the converted portions 134 and additional material 134a, can also be formed and are preferred over diffusion barrier materials that cannot be formed by selective deposition techniques.

Figure 17:
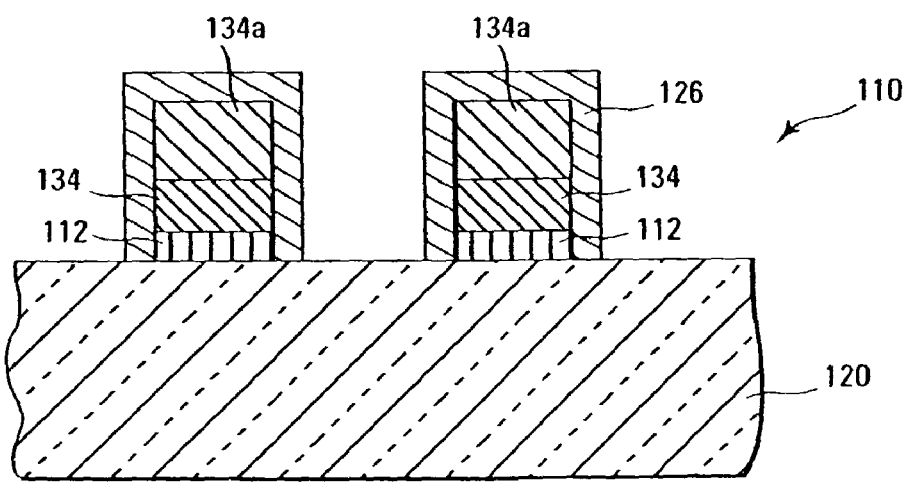

As such, as shown in FIG. 17, and as described herein, conductors such as copper conductors or copper alloy conductors may be preferably formed according to the present invention. The copper conductor forming methods and diffusion barrier layer formation methods described herein can be employed as an alternative to methods wherein predefined damascene trenches are used to define copper conductor patterns in silicon-containing substrates.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the methods as described herein and that the various steps of the methods of alternate embodiments may be combined with steps of other embodiments to produce advantageous methods according to the present invention. Various modifications of the illustrative embodiments, as well as additional embodiments of the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A patterning method comprising:

forming diffusion barrier material on a substrate;

forming a first material on at least a portion of the diffusion barrier material;

transforming at least a surface region of the first material to a second material;

converting one or more portions of the second material to one or more converted portions of first material while at least one or more portions of the second material overlying diffusion barrier material remain;

removing one or more of the remaining portions of second material selectively relative to the one or more converted portions of first material exposing diffusion barrier material thereunder;

removing the exposed diffusion barrier material selectively relative to the one or more converted portions of first material; and increasing a thickness of the one or more converted portions of first material, wherein increasing the thickness of the one or more converted portions of first material comprises electroless deposition first of material on the one or more converted portions of first material.

2. The method of claim 1, wherein transforming at least the surface region of the first material to the second material comprises oxidizing the first material.

3. The method of claim 1, wherein convening one or more portions of the second material to one or more converted portions of first material comprises exposing the one or more portions of second material to radiation.

4. The method of claim 1, wherein forming the diffusion barrier material comprises depositing the diffusion barrier material on the substrate by chemical vapor deposition.

5. The method of claim 1, wherein forming the diffusion barrier material comprises forming the diffusion barrier material on the substrate by electroless deposition.

6. The method of claim 1, further comprising forming an additional diffusion barrier layer over the one or more converted portions of first material having an increased thickness.

7. The method of claim 6, wherein forming the additional diffusion barrier layer comprises electroless depositing diffusion barrier material over the one or more converted portions of first material having an increased thickness.

8. The method of claim 1, wherein transforming at least the surface region of the first material to the second material comprises transforming at least the surface region of the first material to the second material comprising metal oxide.

9. The method of claim 8, wherein forming the first material on the diffusion barrier material comprises forming the first material comprising an elemental metal on the substrate.

10. The method of claim 1, wherein forming the diffusion barrier material on the substrate comprises forming the diffusion barrier material comprising cobalt, tungsten, and phosphorous on the substrate, wherein forming the first material on the diffusion barrier material comprises forming the first material comprising copper on the diffusion barrier material, and further wherein transforming at least the surface region of the first material to the second material comprises transforming at least the surface region of the first material comprising copper to the second material comprising copper oxide.

11. A conductor patterning method comprising:
forming a diffusion barrier material comprising cobalt, tungsten, and phosphorous on a silicon-containing region of a substrate;
forming a first material comprising copper on the diffusion barrier material;
oxidizing at least a surface region of the first material comprising copper to a second material comprising cooper oxide;
converting one or more portions of the second material comprising copper oxide to one or more converted portions of first material comprising copper while leaving at least one or more portions of the second material comprising copper oxide remaining over underlying portions of the diffusion barrier material;
removing one or more of the remaining portions of second material comprising cooper oxide selectively relative to the one or more converted portions of first material comprising copper exposing underlying diffusion barrier material;
removing the exposed diffusion barrier material; and
increasing a thickness of one or more converted portions of the first material comprising copper, wherein increasing the thickness comprises depositing first material on the one or more converted portions of first material comprising copper by electroless deposition.

12. The method of claim 11, wherein converting the one or more portions of the second material comprising copper oxide to the one or more converted portions of the first material comprising copper comprises photoreducing one or more portions of the second material comprising copper oxide to copper.

13. The method of claim 11, wherein forming the diffusion barrier material comprises depositing a barrier material comprising cobalt, tungsten, and phosphorous by chemical vapor deposition.

14. The method of claim 11, wherein forming the diffusion barrier material comprises depositing the diffusion barrier material comprising cobalt, tungsten, and phosphorous by electroless deposition.

15. The method of claim 11, wherein the method further comprises forming additional diffusion barrier material over the one or more converted portions of the first material comprising copper having an increased thickness to provide a baffler completely about the converted portions.

16. The method of claim 15, wherein forming the additional diffusion barrier material comprises forming diffusion barrier material comprising cobalt, tungsten, and phosphorous.

17. The method of claim 15, wherein forming the additional diffusion barrier material over the one or more converted portions of the first material comprises forming additional diffusion barrier material by selective deposition over the one or more converted portions.

18. The method of claim 11, wherein removing one or more of the remaining portions of second material comprising copper oxide selectively relative to the first material comprising copper comprises exposing the one or more remaining portions of second material comprising copper oxide to a gaseous etchant.

19. The method of claim 18, wherein removing one or more of the remaining portions of second material comprising copper oxide selectively relative to the first material comprising copper comprises exposing the one or more remaining portions of second material comprising copper oxide to hexafluoroacetylacetone.

20. The method of claim 11, wherein removing the exposed diffusion barrier material comprises one of removing the exposed diffusion barrier material by at least one of ion milling or sputter etching.

21. A conductor patterning method comprising:
forming a diffusion barrier material comprising cobalt, tungsten, and phosphorous on a silicon-containing region of a substrate;
forming a first material comprising copper on the diffusion barrier material;
oxidizing at least a surface region of the first material comprising copper to a second material comprising copper oxide;
converting one or more portions of the second material comprising copper oxide to one or more converted portions of first material comprising copper while leaving at least one or more portions of the second material comprising cooper oxide remaining over underlying portions of the diffusion barrier material;
removing one or more of the remaining portions of second material comprising copper oxide selectively relative to the one or more converted portions of first material comprising copper exposing underlying diffusion barrier material;

removing the exposed diffusion barrier material;

increasing a thickness of one or more converted portions of the first material comprising copper; by depositing the first material comprising copper on the one or more converted portions of the first material comprising copper; and forming additional diffusion barrier material over the one or more converted portions of the first material comprising copper having the increased thickness to provide a barrier completely about the converted portions.

22. The method of claim 21, wherein forming the additional diffusion barrier material comprises forming diffusion barrier material comprising cobalt, tungsten, and phosphorous.

23. The method of claim 21, wherein forming the additional diffusion barrier material over the one or more converted portions of the first material comprises forming additional diffusion barrier material by selective deposition over the one or more converted portions.

24. The method of claim 21, wherein converting the one or more portions of the second material comprising copper oxide to the one or more converted portions of the first material comprising copper comprises photoreducing one or more portions of the second material comprising copper oxide to copper.

25. The method of claim 21, wherein forming the diffusion barrier material comprises depositing a barrier material comprising cobalt, tungsten, and phosphorous by chemical vapor deposition.

26. The method of claim 21, wherein forming the diffusion barrier material comprises depositing the diffusion barrier material comprising cobalt, tungsten, and phosphorous by electroless deposition.

27. The method of claim 21, wherein increasing the thickness comprises electroplating material on the one or more converted portions comprising copper.

28. The method of claim 21, wherein increasing the thickness comprises depositing material on the one or more converted portions of first material comprising copper by electroless deposition.

29. The method of claim 21, wherein removing one or more of the remaining portions of second material comprising copper oxide selectively relative to the first material comprising copper comprises exposing the one or more remaining portions of second material comprising copper oxide to a gaseous etchant.

30. The method of claim 29, wherein removing one or more of the remaining portions of second material comprising copper oxide selectively relative to the first material comprising copper comprises exposing the one or more remaining portions of second material comprising copper oxide to hexafluoroacetylacetone.

31. The method of claim 21, wherein removing the exposed diffusion barrier material comprises one of removing the exposed diffusion barrier material by at least one of ion milling or sputter etching.

32. The method of claim 21, wherein forming the additional diffusion barrier material over the one or more converted portions of the first material comprises forming additional diffusion barrier material using electroless deposition.

33. A conductor patterning method comprising:

forming a diffusion barrier material comprising cobalt, tungsten, and phosphorous on a silicon-containing region of a substrate;

forming a first material comprising copper on the diffusion barrier material;

oxidizing at least a surface region of the first material comprising copper to a second material comprising copper oxide;

converting one or more portions of the second material comprising copper oxide to one or more converted portions of first material comprising copper while leaving at least one or more portions of the second material comprising copper oxide remaining over underlying portions of the diffusion barrier material;

removing one or more of the remaining portions of second material comprising copper oxide selectively relative to the first material comprising copper exposing underlying diffusion barrier material;

removing the exposed diffusion barrier material;

increasing a thickness of the one or more converted portions of first material comprising copper by depositing the first material comprising copper on the one or more converted portion of the first material comprising copper; and forming additional diffusion barrier material over the one or more converted portions of the first material comprising copper having the increased thickness to provide a barrier completely about the converted portions, wherein forming the additional diffusion barrier material over the one or more converted portions of the first material comprises forming additional diffusion barrier material using electroless deposition.

34. The method of claim 33, wherein forming the additional diffusion barrier material comprises forming diffusion barrier material comprising cobalt, tungsten, and phosphorous.

35. The method of claim 33, wherein converting the one or more portions of the second material comprising copper oxide to the one or more converted portions of the first material comprising copper comprises photoreducing one or more portions of the second material comprising copper oxide to copper.

36. The method of claim 33, wherein forming the diffusion barrier material comprises depositing a barrier material comprising cobalt, tungsten, and phosphorous by chemical vapor deposition.

37. The method of claim 33, wherein forming the diffusion barrier material comprises depositing the diffusion barrier material comprising cobalt, tungsten, and phosphorous using electroless deposition.

38. The method of claim 33, wherein removing one or more of the remaining portions of second material comprising copper oxide selectively relative to the first material comprising copper comprises exposing the one or more remaining portions of second material comprising copper oxide to a gaseous etchant.

39. The method of claim 38, wherein removing one or more of the remaining portions of second material comprising copper oxide selectively relative to the first material comprising copper comprises exposing the one or more remaining portions of second material comprising copper oxide to hexafluoroacetylacetone.

40. The method of claim 33, wherein removing the exposed diffusion barrier material comprises one of removing the exposed diffusion barrier material by at least one of ion milling or sputter etching.

41. A patterning method comprising:
  forming diffusion baffler material on a substrate;
  forming a first material on at least a portion of the diffusion barrier material;
  transforming at least a surface region of the first material to a second material;
  converting one or more portions of the second material to one or more converted portions of first material while at least one or more portions of the second material overlying diffusion barrier material remain;
  removing one or more of the remaining portions of second material selectively relative to the one or more converted portions of first material exposing diffusion barrier material thereunder;
  removing the exposed diffusion barrier material selectively relative to the one or more converted portions of first material;
  increasing a thickness of the one or more converted portions of the first material by depositing the first material on the one or more converted portions of the first material;
  forming an additional diffusion barrier material over the one or more converted portions of the first material having the increased thickness using electroless deposition.

42. The method of claim 41, wherein transforming at least the surface region of the first material to the second material comprises oxidizing the first material.

43. The method of claim 41, wherein converting one or more portions of the second material to one or more converted portions of first material comprises exposing the one or more portions of second material to radiation.

44. The method of claim 41, wherein forming the diffusion barrier material comprises depositing the diffusion barrier material on the substrate by chemical vapor deposition.

45. The method of claim 41, wherein forming the diffusion barrier material comprises forming the diffusion barrier material on the substrate by electroless deposition.

46. The method of claim 41, wherein transforming at least the surface region of the first material to the second material comprises transforming at least the surface region of the first material to the second material comprising metal oxide.

47. The method of claim 46, wherein forming the first material on the diffusion barrier material comprises forming the first material comprising an elemental metal on the substrate.

48. The method of claim 41, wherein forming the diffusion barrier material on the substrate comprises forming the diffusion barrier material comprising cobalt, tungsten, and phosphorous on the substrate, wherein forming the first material on the diffusion barrier material comprises forming the first material comprising copper on the diffusion barrier material, and further wherein transforming at least the surface region of the first material to the second material comprises transforming at least the surface region of the first material comprising copper to the second material comprising copper oxide.

* * * * *

UNITED STATES PATENT AND TRADEMARK OFFICE
CERTIFICATE OF CORRECTION

PATENT NO. : 6,972,257 B2
APPLICATION NO. : 10/462476
DATED : December 6, 2005
INVENTOR(S) : Geusic et al.

It is certified that error appears in the above-identified patent and that said Letters Patent is hereby corrected as shown below:

Column 1,
Line 3, insert the following paragraph:
-- This is a divisional application Serial No. 09/648,884, filed August 25, 2000, issued as U.S. Patent No. 6,602,653, which is incorporated herein by reference. -;

Column 13,
Line 10, delete "convening" and insert -- converting --.

Signed and Sealed this

Twentieth Day of June, 2006

JON W. DUDAS
*Director of the United States Patent and Trademark Office*